Sept. 15, 1970 B. G. CONKLIN 3,529,184

LOW POWER TRANSISTOR TRIGGER CIRCUIT

Filed May 18, 1967

INVENTOR
BARRY GLENN CONKLIN

BY Brady, O'Boyle & Gates
ATTORNEYS

United States Patent Office 3,529,184

Patented Sept. 15, 1970

3,529,184

LOW POWER TRANSISTOR TRIGGER CIRCUIT

Barry G. Conklin, State College, Pa., assignor to HRB-Singer, Inc., State College, Pa., a corporation of Delaware Filed May 18, 1967, Ser. No. 639,522
Int. Cl. H03k 3/286
U.S. Cl. 307—290 5 Claims

ABSTRACT OF THE DISCLOSURE

A waveform squaring circuit responsive to predetermined input amplitude levels having a square wave output whose base line is substantially zero volts.

BACKGROUND OF THE INVENTION

Many digital circuits require that a device such as a counter or gate be operated from an incoming signal of indeterminate shape and amplitude. Common practice normally dictates the use of an amplitude discriminator such as the well-known Schmitt Trigger Circuit to obtain sharp rectangular waveforms of inputs such as sinewaves, etc. It is well known to those skilled in the art that transistorized Schmitt Trigger Circuits have an output which swings from the supply voltage level (B+) when the output transistor is non-conductive to the potential across the emitter electrode (typically 1 volt) when the output transistor is conductive. Also, the upper frequency limit of operation is anywhere from 15 to 20 megacycles per second (mc.). Beyond this frequency there is no output whatever since the circuit ceases triggering. This principal disadvantage of the Schmitt Trigger Circuit is that the output stage emitter is always at some appreciable positive voltage. This inherent property makes it extremely difficult and sometimes impossible to drive integrated circuit type logic elements which require a "zero" or base line level of substantially zero volts.

A typical transistorized Schmitt Trigger Circuit is illustrated in "A Handbook of Selected Semiconductor Circuits," NObsr72321, Naveships 93484, Bureau of Ships, Department of the Navy, at pages 6–53, Circuit No. 6–18.

SUMMARY

The present invention is an improved transistor trigger circuit of the Schmitt Trigger type whereby a substantially zero base line output can be provided by utilizing three transistors instead of the two required for a Schmitt Trigger Circuit and wherein a first transistor operates as an input transistor and the second transistor operates as the output transistor but additionally, the third transistor is coupled between the collector circuit of the output transistor back to the emitter circuit of the input transistor and returning the emitter of the output transistor to a point of reference potential, e.g., ground. The third transistor operates as a positive feed-back means to the formerly common emitter resistor. This allows the output emitter to be grounded, thus eliminating the zero level problem.

DESCRIPTION OF THE PREFERRED EMBODIMENTS

Figure 1:
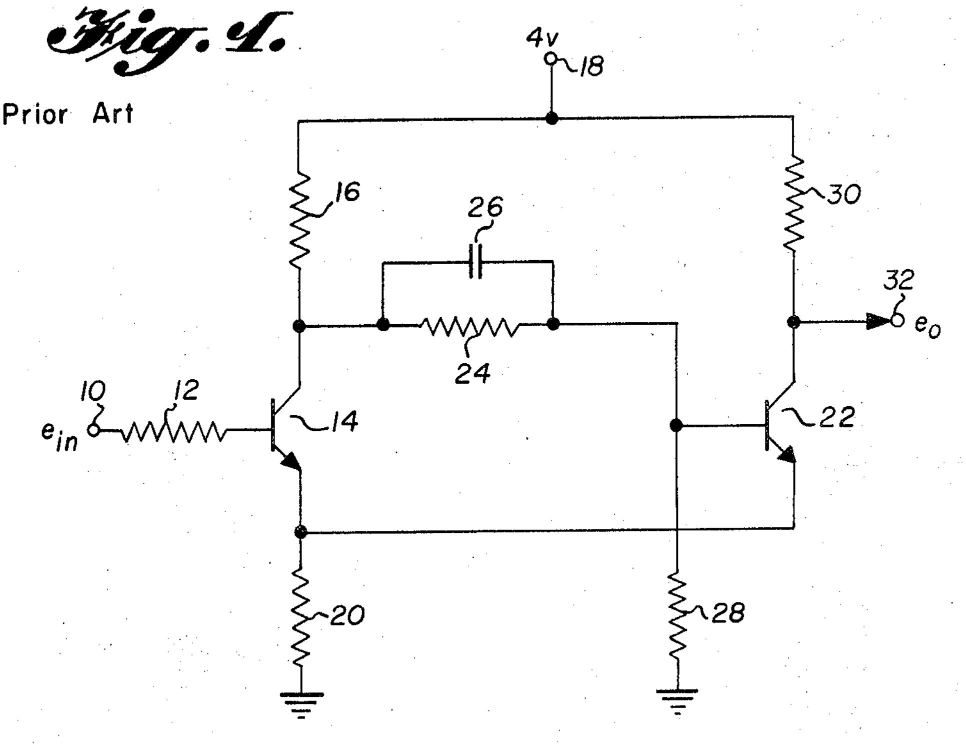
Fig. 1. Prior Art
FIG. 1 is a schematic electrical diagram of a conventional Schmitt Trigger Circuit which comprises known prior art.

Referring to FIG. 1 which illustrates a conventional Schmitt Trigger Circuit, an input voltage $e_{in}$ is coupled to an input terminal 10 to which is connected an input resistor 12. The input resistor 12 is coupled to the base of transistor 14 which has its collector coupled to a source of positive potential not shown by means of the collector load resistor 16 and voltage terminal 18. Transistor 14 is illustrated as being an n-p-n transistor thereby requiring a positive voltage to be applied as the supply voltage to the collector. The emitter is returned to a point of reference potential illustrated as ground by means of the emitter resistor 20. A second transistor 22 which is referred to as the output transistor is coupled to the input transistor 14 by means of resistor 24 in parallel with capacitor 26 connected from a collector of transistor 14 to the base of transistor 22. A resistor 28 is coupled from the base of transistor 22 to ground. The emitter of transistor 22 is commonly connected to the emitter of transistor 14. The emitter resistor 20 is therefore common to both emitters providing the positive feedback effect which results in the snap triggering action which is inherent in the operation of the circuit to provide the square wave output. The output transistor 22 is illustrated as being an n-p-n transistor having its collector coupled to a positive supply potential supplied at terminal 18 by means of the collector load resistor 30.

It is well known to those skilled in the art that the base of the normally non-conductive input transistor 14 can be biased to become conductive at a predetermined input level such that when this level is exceeded, extremely fast switching action takes place causing the normally conductive output transistor 22 to become non-conductive and remain in this state until such time as the input voltage falls below the predetermined level causing transistor 14 to become non-conductive. The wave form squaring effect is achieved as noted above by the common emitter resistor 20. In circuit operation however when transistor 22 is conductive an inherent voltage drop occurs across resistor 20 which is present at the output terminal 32 due to the fact that the transistor in its conductive state acts like a closed switch or a very small series resistance between the collector load resistor 30 and the emitter resistor 20. In most applications the offset of the output signal $e_o$ from the zero voltage level or ground potential is of no consequence; however, integrated circuits-type logic elements require a base line voltage which is substantially nearer to zero than the relatively high base line voltage provided by the circuits shown in FIG. 1.

The present invention is similar to the circuit shown in FIG. 1 with the exception that the common connection between the emitters of transistors 14 and 22 is removed and a direct connection to ground is made for the emitter of the output transistor 22. Additionally, a third transistor 34 is coupled between the output terminal 32 which is common to the collector of transistor 22 back to the emitter of transistor 14. More particularly, the base of transistor 34 is coupled to the collector of transistor 22 by means of resistor 36. Transistor 34 is likewise illustrated as being an n-p-n transistor. The emitter of transistor 34 is directly connected to ground while the collector is directly connected to the emitter of transistor 14. A collector load resistor 38 is coupled between the collector of transistor 34 and terminal 18 to which is applied a positive supply voltage. The connection of transistor 34 from the collector of transistor 22 back to the emitter of transistor 14 provides a positive feed-back similar to that achieved by the direct connection of the emitters in the circuit in FIG. 1. This being the case, the snap action occurs in an identical manner; however, the emitter of transistor 22 is directly connected to ground and therefore when it becomes fully conductive, the voltage at the collector falls substantially to ground potential. For example, where a +4 volt supply voltage is utilized, the collectable voltage and consequently the output voltage $e_0$ falls to approximately 0.2 volt. This base line level is of a proper magnitude to drive integrated type logic elements which require a "zero" level signal.

Figure 2:
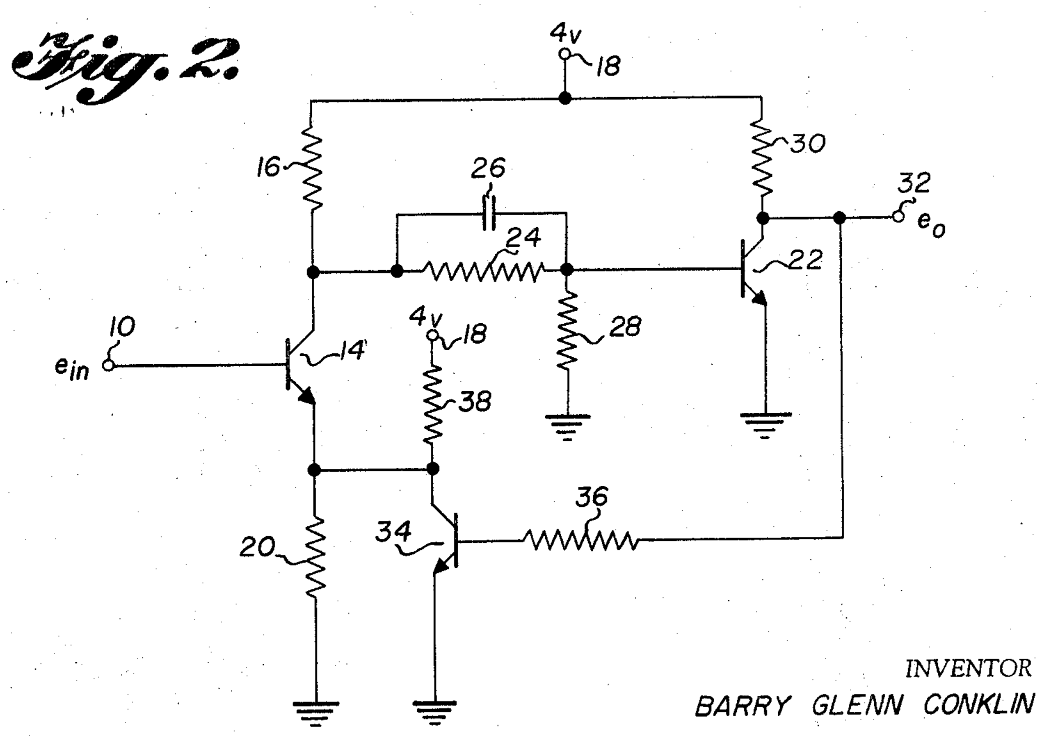
FIG. 2 is a schematic electrical diagram of the circuit comprising the subject invention.

When 2N708 transistors were employed in the circuits shown in FIG. 2, the following typical values were utilized for the components shown:

R16—270 ohms
R20—47 ohms
R24—3 kilohms
C26—56 micro-microfarads
R28—5.1 kilohms
R30—120 ohms
R36—10 kilohms
R38—1.2 kilohms With the values as tabulated above, useful operation is provided up to a frequency range of 50 megacycles. Moreover, the electrical characteristics, as measured, are:

Input Z—Approximately 10 kilohms
Output Z—Approximately 100 ohms
Input Trigger Level—+1.025 volts
Hysterisis—Approximately .05 volt
Output levels—+0.2 and +4.0 volts (no load)
Fall time—From +4 to +0.2 volts in less than 10 nanoseconds
Power consumption—80 milliwatts avg.
Temperature range——50° to +175° F. tested What has been shown and described therefore is an improved amplitude sensitive trigger circuit capable of providing a substantially zero base line output with the additional feature of extending the operating frequency of such circuits far beyond that achieved by the conventional squaring circuit of the Schmitt Trigger type.

I claim:

1. A trigger circuit powered from a source of predetermined supply voltage, comprising in combination: first, second, and third interconnected transistors each having a base, a collector, and an emitter; input means coupled to the base of said first transistor for applying an input signal thereto, said first transistor being normally non-conductive in absence of said input signal; first collector load impedance means coupled between the collector of said first transistor and said supply voltage; emitter resistance means coupled between the emitter of said first transistor and a point of reference potential; impedance means coupled between the collector of said first transistor and the base of said second transistor; bias resistor means coupled between the base of said second transistor and said point of reference potential operating in combination with said first collector load impedance means and said impedance means coupled between a collector of said first transistor and the base of said second transistor for biasing said second transistor in a normally conductive state in absence of an input signal; second collector load impedance means coupled between the collector of said second transistor and said supply voltage; output means coupled to the collector of said second transistor for providing an output signal thereat; means coupling the emitter of said second transistor directly to said point of reference potential; first circuit means for coupling the base of said third transistor to the collector of said transistor; second circuit means directly connecting the collector of said third transistor to the emitter of said first transistor; third circuit means directly connecting the emitter of said third transistor to said point of reference potential; and third collector load impedance means coupled between the collector of said third transistor and said supply voltage; whereby said third transistor is coupled to said second transistor and said first transistor in positive feed-back relationship to effect a snap triggering action of said second transistor to become non-conductive and conductive whenever said first transistor becomes conductive and non-conductive respectively.

2. The invention as defined by claim 1 wherein said first circuit means comprises a resistive means coupled between the collector of said second transistor and the base of said third transistor.

3. The invention as defined by claim 1 wherein said first, second and third interconnected transistors are of like conductivity, being either n-p-n or p-n-p transistors.

4. The invention as defined by claim 1 wherein said impedance means coupled between the collector of said first transistor and the base of said second transistor comprises a resistive means and a capacitive means coupled together in parallel.

5. The invention as defined by claim 1 wherein said first, second and third collector load impedance means comprises a collector load resistor.

References Cited

UNITED STATES PATENTS

| | | | |
|---|---|---|---|
| 3,175,101 | 3/1965 | Van Dine | 307—263 |
| 3,214,602 | 10/1965 | Heyning et al. | 307—273 X |
| 3,291,916 | 12/1966 | Jorgensen | 307—291 X |

JOHN S. HEYMAN, Primary Examiner

U.S. Cl. X.R.

307—263, 268, 291